United States Patent
Kimura et al.

(10) Patent No.: US 9,312,372 B2
(45) Date of Patent: Apr. 12, 2016

(54) SEMICONDUCTOR DEVICE (71) Applicants: Keisuke Kimura, Nagakute (JP); Satoru Kameyama, Toyota (JP)

(72) Inventors: Keisuke Kimura, Nagakute (JP); Satoru Kameyama, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/766,023

(22) PCT Filed: Feb. 13, 2013

(86) PCT No.: PCT/JP2013/053418
§ 371 (c)(1),
(2) Date: Aug. 5, 2015

(87) PCT Pub. No.: WO2014/125583
PCT Pub. Date: Aug. 21, 2014

(65) Prior Publication Data
US 2015/0380536 A1    Dec. 31, 2015

(51) Int. Cl.
  *H01L 29/73*   (2006.01)
  *H01L 29/739*  (2006.01)
  *H01L 29/10*   (2006.01)
  *H01L 29/06*   (2006.01)
  *H01L 29/08*   (2006.01)

(52) U.S. Cl.
  CPC ........ *H01L 29/7397* (2013.01); *H01L 29/0696* (2013.01); *H01L 29/0834* (2013.01); *H01L 29/1095* (2013.01)

(58) Field of Classification Search
  CPC ............ H01L 29/7397; H01L 29/1095; H01L 29/0696; H01L 29/0834; H01L 22/32; H01L 27/088; G01R 31/2621

USPC .......... 257/144, 140, 139, E27.022; 438/138
  See application file for complete search history.

(56) References Cited

U.S. PATENT DOCUMENTS

| | | | | |
|---|---|---|---|---|
| 6,114,727 A * | 9/2000 | Ogura | ................. | H01L 29/0696 257/212 |
| 7,622,351 B2 * | 11/2009 | Kobayashi | .......... | H01L 29/0696 257/330 |
| 8,552,468 B2 * | 10/2013 | Narazaki | ............. | H01L 29/4236 257/133 |
| 2013/0240947 A1 * | 9/2013 | Matsudai | ............ | H01L 29/7395 257/139 |

FOREIGN PATENT DOCUMENTS

| JP | 2001-144293 A | 5/2001 |
|---|---|---|
| JP | 2009-141202 A | 6/2009 |
| JP | 2010-263149 A | 11/2010 |

* cited by examiner

*Primary Examiner* — Howard Weiss
*Assistant Examiner* — Sue Tang
(74) *Attorney, Agent, or Firm* — Oliff PLC (57) ABSTRACT

A semiconductor device in which an element region including at least an IGBT region is formed on a semiconductor substrate is presented. The IGBT region including: a collector layer; a drift layer; a body layer; a gate electrode placed inside a trench extending from the front surface of the semiconductor substrate to the drift layer; an emitter layer; and a contact layer having a higher impurity concentration than the body layer. In the semiconductor device, assuming that an x direction is a direction in which the trench extends along the front surface of the semiconductor substrate and that a y direction is a direction orthogonal to the x direction along the front surface of the semiconductor substrate, a distance from the contact layer to the emitter layer in the x direction is larger than a distance from the contact layer to the trench in the y direction.

4 Claims, 6 Drawing Sheets

FIG. 6

SEMICONDUCTOR DEVICE

TECHNICAL FIELD

The present application relates to a semiconductor device.

BACKGROUND ART

JP 2009-141202 A discloses a semiconductor device in which an element region including an IGBT region is formed on a semiconductor substrate. Provided on a front surface of the semiconductor substrate is a front surface electrode, and a back surface electrode is provided on a back surface of the semiconductor substrate. The IGBT region includes: a collector layer of a first conductivity type, the collector layer being in contact with the back surface electrode; a drift layer of a second conductivity type that is provided on a front surface side of the semiconductor substrate with respect to the collector layer; a body layer of the first conductivity type that is provided on the front surface side of the semiconductor substrate with respect to the drift layer, the body layer being in contact with the front surface electrode; a gate electrode placed inside a trench extending from the front surface of the semiconductor substrate to the drift layer and which is insulated from the semiconductor substrate and the front surface electrode by an insulator film; an emitter layer of the second conductivity type that is provided between the body layer and the front surface electrode, the emitter layer being in contact with the insulator film of the gate electrode and the front surface electrode; and a contact layer of the first conductivity type that is provided between the body layer and the front surface electrode, the contact layer being in contact with the front surface electrode and having a higher impurity concentration than the body layer.

SUMMARY OF INVENTION

Technical Problem

In the semiconductor device described above, the IGBT region may also be made to function as a diode. When the IGBT region is operating as a diode, holes are injected from the contact layer into the drift layer. Therefore, in order to reduce a switching loss during diode operation, it is effective to reduce the amount of holes that are injected from the contact layer into the drift layer. A reduction in size of the contact layer of the IGBT region reduces the amount of holes that are injected from the contact layer into the drift layer, thus making it possible to reduce a switching loss during diode operation.

However, a mere reduction in size of the contact layer of the IGBT region causes a lowering in RBSOA tolerance during IGBT operation. When the IGBT region is turned off, the holes accumulated in the drift layer flow along the trench up to the body layer near the front surface, and concentratedly flow from the body layer near the front surface into the contact layer. In so doing, if the distance between the trench and the contact layer is made to be large, the holes concentratedly flow through a larger area of the body layer, thus making it easy for a latch-up phenomenon to occur. This causes a lowering in the RBSOA tolerance of the semiconductor device.

The present specification provides a technology for solving the problem described above. The present specification provides a technology for enabling a semiconductor device in which an IGBT region is formed on a semiconductor substrate to reduce a switching loss during diode operation while ensuring RBSOA tolerance during IGBT operation.

Solution to Technical Problem

The present specification discloses a semiconductor device in which an element region including at least an IGBT region is formed on a semiconductor substrate. The semiconductor device has a front surface electrode provided on a front surface of the semiconductor substrate and a back surface electrode provided on a back surface of the semiconductor substrate. The IGBT region includes: a collector layer of a first conductivity type, the collector layer being in contact with the back surface electrode; a drift layer of a second conductivity type that is provided on a front surface side of the semiconductor substrate with respect to the collector layer; a body layer of the first conductivity type that is provided on the front surface side of the semiconductor substrate with respect to the drift layer, the body layer being in contact with the front surface electrode; a gate electrode placed inside a trench extending from the front surface of the semiconductor substrate to the drift layer and that is insulated from the semiconductor substrate and the front surface electrode by an insulator film; an emitter layer of the second conductivity type that is provided between the body layer and the front surface electrode, the emitter layer being in contact with the insulator film of the gate electrode and the front surface electrode; and a contact layer of the first conductivity type that is provided between the body layer and the front surface electrode, the contact layer being in contact with the front surface electrode and having a higher impurity concentration than the body layer. In the semiconductor device, assuming that an x direction is a direction in which the trench extends along the front surface of the semiconductor substrate and a y direction is a direction orthogonal to the x direction along the front surface of the semiconductor substrate, a distance from the contact layer to the emitter layer in the x direction is larger than a distance from the contact layer to the trench in the y direction.

The semiconductor device described above is configured such that the distance from the contact layer to the trench is small. With this configuration, when the IGBT region is turned off and the holes accumulated in the drift layer subsequently flow along the trench up to the body layer near the front surface, then flow from the body layer near the front surface into the contact layer, it possible to narrow the area in the body layer through which the holes concentratedly flow. This suppresses the occurrence of a latch-up phenomenon, thus making it possible to ensure the RBSOA tolerance of the semiconductor device.

Further, the semiconductor device described above allows the contact layer to be made smaller by increasing the distance from the contact layer to the emitter layer. This suppresses the injection of holes into the drift layer during diode operation, thus making it possible to reduce a switching loss.

DESCRIPTION OF EMBODIMENTS

The semiconductor device disclosed herein may be configured to further include a carrier accumulation layer of the second conductivity type, the carrier accumulation layer being provided inside the body layer so as to intervene between the drift layer and the front surface electrode.

In a semiconductor device having such a carrier accumulation layer, when the IGBT region is on, the flow of carriers (holes) from the drift layer to the front surface electrode through the body layer is suppressed by the carrier accumulation layer. This causes a large amount of carriers to be present in the drift layer, thus reducing the electrical resistance of the drift layer and reducing the on-voltage of the semiconductor device. Moreover, when the IGBT region is turned off, the large amount of holes accumulated in the drift layer flow along the trench up to the body layer near the front surface, and flow from the body layer near the front surface into the contact layer. The semiconductor device described above makes it possible to narrow an area in the body layer through which a large amount of holes concentratedly flow when the IGBT region is turned off. This suppresses the occurrence of a latch-up phenomenon, thus making it possible to ensure the RBSOA tolerance of the semiconductor device.

The semiconductor device disclosed herein may be configured such that a distance from the contact layer to the emitter layer in the x direction in a peripheral part of the element region is smaller than a distance from the contact layer to the emitter layer in the x direction in another part of the element region.

When the IGBT region is turned off, the holes concentratedly flow through the contact layer, particularly in the peripheral part of the element region. For this reason, making the contact layer in the peripheral part of the element region small causes a lowering in the RBSOA tolerance of the semiconductor device. In the semiconductor device described above, such a lowering in the RBSOA tolerance of the semiconductor device can be prevented by making the contact layer in the peripheral part of the element region larger than the contact layer in another part of the element region.

The semiconductor device disclosed herein may be configured such that a sense IGBT region is further formed on the semiconductor substrate, and the sense IGBT region includes: a sense collector layer of a first conductivity type, the sense collector layer being in contact with the back surface electrode; a sense drift layer of a second conductivity type that is provided on the front surface side of the semiconductor substrate with respect to the sense collector layer; a sense body layer of the first conductivity type that is provided on the front surface side of the semiconductor substrate with respect to the sense drift layer, the sense body layer being in contact with the front surface electrode; a sense gate electrode placed inside a trench extending from the front surface of the semiconductor substrate to the sense drift layer and that is insulated from the semiconductor substrate and the front surface electrode by an insulator film; a sense emitter layer of the second conductivity type that is provided between the sense body layer and the front surface electrode, the sense emitter layer being in contact with the insulator film of the sense gate electrode and the front surface electrode; and a sense contact layer of the first conductivity type that is provided between the sense body layer and the front surface electrode, the sense contact layer being in contact with the front surface electrode and having a higher impurity concentration than the sense body layer, wherein a distance from the sense contact layer to the sense emitter layer in the x direction in the sense IGBT region is smaller than a distance from the contact layer to the emitter layer in the x direction in the IGBT region.

The sense region intrinsically has low breakdown tolerance, and making the sense contact layer of the sense region small causes a further lowering in the breakdown tolerance of the sense region. In the semiconductor device described above, the breakdown tolerance of the sense region can be ensured by making the sense contact layer of the sense region large.

Embodiments

Figure 1:
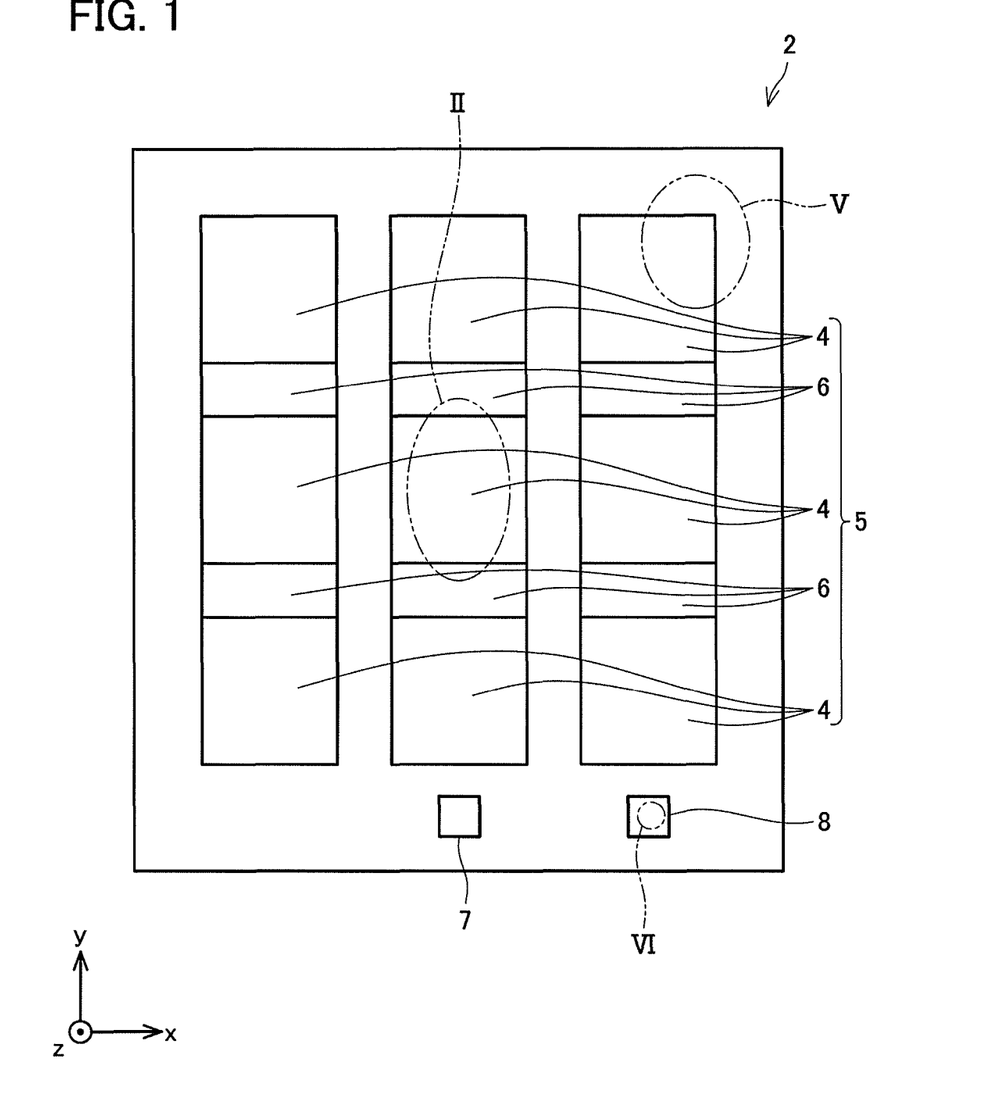
FIG. 1 is a plan view of a semiconductor device 2 of an embodiment.

FIG. 1 shows a semiconductor device 2 of the present embodiment. The semiconductor device 2 includes an IGBT region 4, a diode region 6, and a sense region 8. The IGBT region 4, the diode region 6, and the sense region 8 are formed on the same semiconductor substrate. The semiconductor device 2 is a so-called reverse conductive (RC) IGBT. In the following, a combination of the IGBT region 4 and the diode region 6 is sometimes referred to as an element region 5.

On a front surface of the semiconductor substrate, a plurality of trenches 10 (not illustrated in FIG. 1) are formed parallel to each other. In the semiconductor device 2, a plurality of IGBT regions 4 and a plurality of diode regions 6 are placed alternately in a direction (y direction) orthogonal to a direction (x direction) in which the trenches 10 extend.

Figure 2:
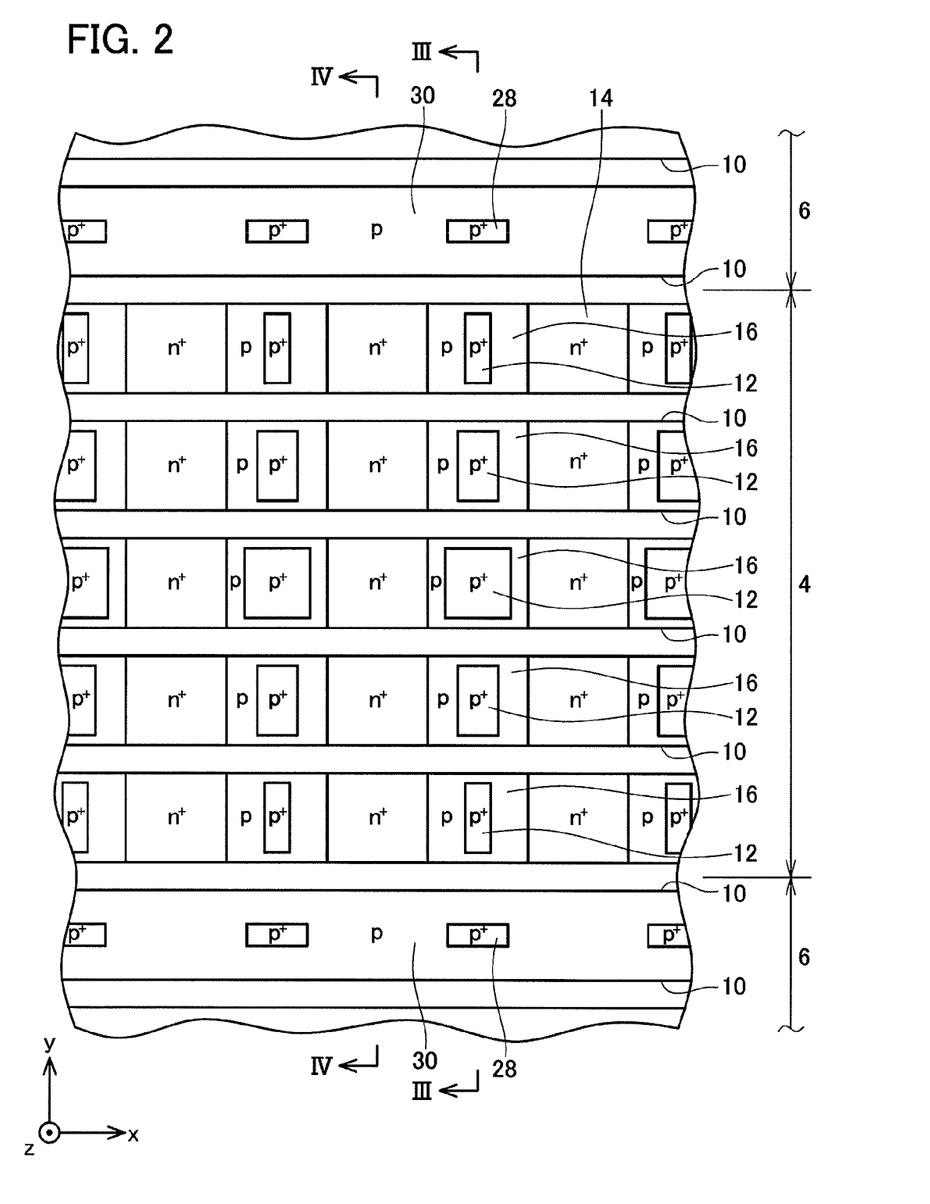
FIG. 2 is a plan view showing the details of the portion II of FIG. 1.
Figure 3:
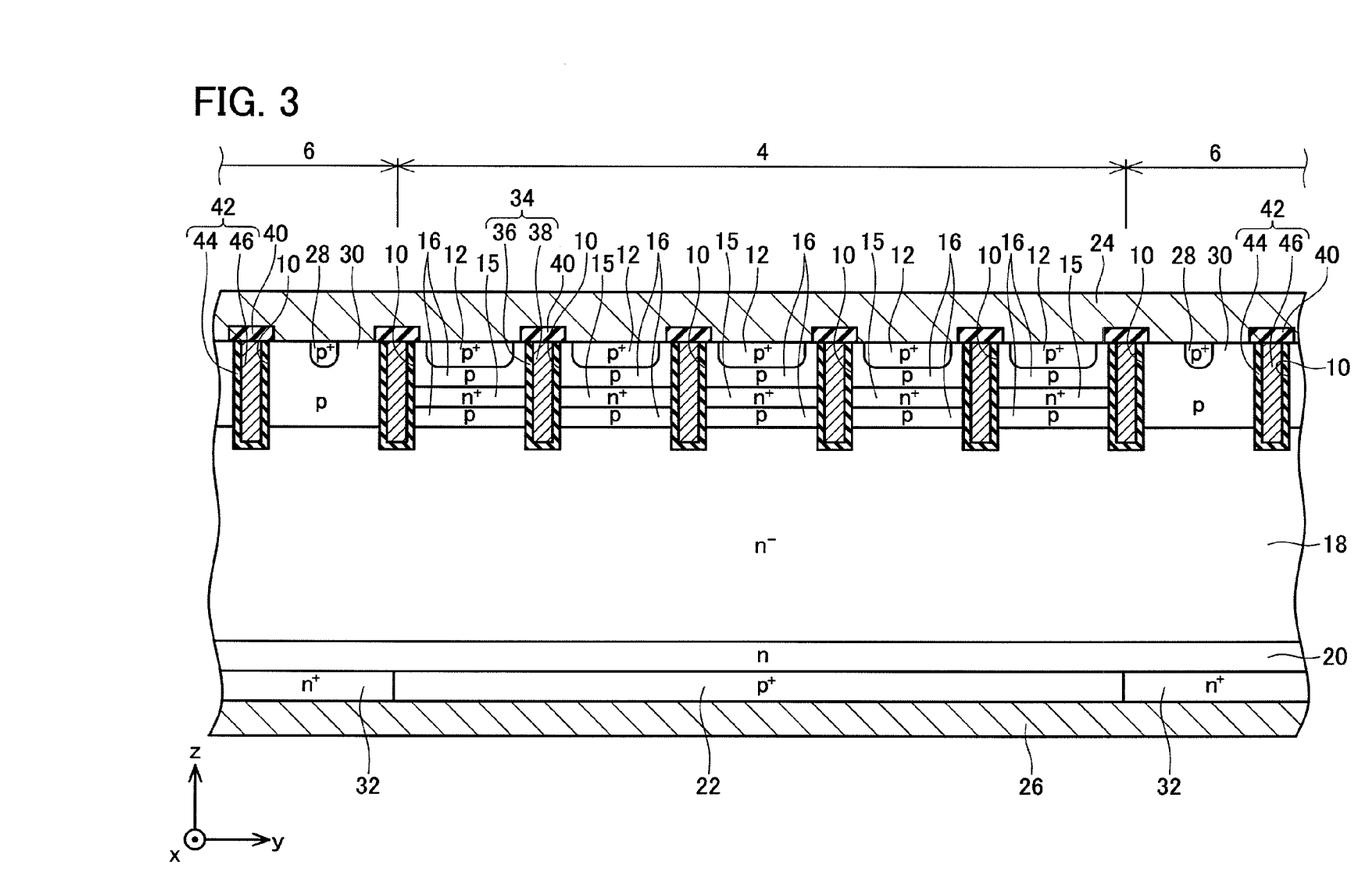
FIG. 3 is a cross-sectional view taken along the line III-III of FIG. 2.
Figure 4:
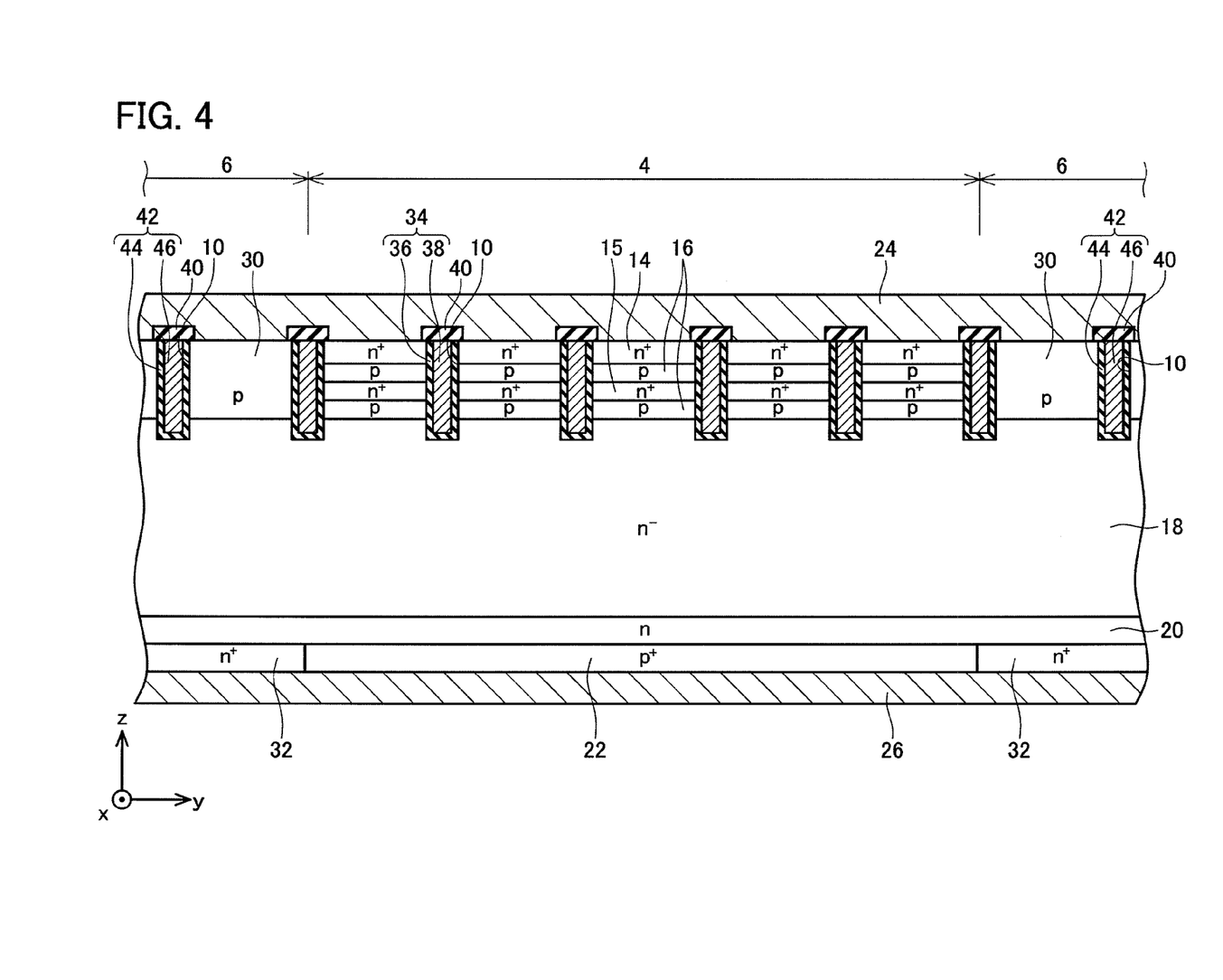
FIG. 4 is a cross-sectional view taken along the line IV-IV of FIG. 2.

FIGS. 2 to 4 show the details of each of the IGBT regions 4. It should be noted that FIG. 2 omits to illustrate the below-described front surface electrode 24, insulated gate 34, front surface insulator film 40, and dummy gate 42. As shown in FIGS. 2 to 4, the IGBT region 4 includes: a body contact layer 12 made of a p-type semiconductor having a high impurity concentration; an emitter layer 14 made of an n-type semiconductor having a high impurity concentration; a body layer 16 made of a p-type semiconductor; a carrier accumulation layer 15 made of an n-type semiconductor having a high impurity concentration; a drift layer 18 made of an n-type semiconductor having a low impurity concentration; a buffer layer 20 made of an n-type semiconductor; and a collector layer 22 made of a p-type semiconductor having a high impurity concentration. The impurity concentration of the body layer is, for example, in the range of approximately $10^{15}$ to $10^{17}$ [cm$^{-3}$], and the impurity concentration of the body contact layer 12 is, for example, in the range of approximately $10^{17}$ to $10^{20}$ [cm$^{-3}$]. The body contact layer 12, the emitter layer 14, and the body layer 16 are exposed on the front surface of the semiconductor substrate, and are in contact with the front surface electrode 24. The body contact layer 12 and the emitter layer 14 are partially formed in a surface layer portion of the body layer 16. The carrier accumulation layer 15 is formed inside the body layer 16 so as to intervene between the drift layer 18 and the front surface electrode 24. The drift layer 18 is formed on a back surface of the body layer 16. The buffer layer 20 is formed on a back surface of the drift layer 18. The collector layer 22 is formed on a back surface of the buffer layer 20. The collector layer 22 is exposed on a back surface of the semiconductor substrate, and is in contact with a back surface electrode 26.

Each of the diode regions 6 includes: an anode contact layer 28 made of a p-type semiconductor having a high impurity concentration; an anode layer 30 made of a p-type semiconductor, a drift layer 18 made of an n-type semiconductor having a low impurity concentration; a buffer layer 20 made of an n-type semiconductor, and a cathode layer 32 made of an n-type semiconductor having a high impurity concentration. The anode contact layer 28 and the anode layer 30 are exposed on the front surface of the semiconductor substrate, and are in contact with the front surface electrode 24. The anode contact layer 28 is partially formed in a surface layer portion of the anode layer 30. The drift layer 18 is formed on a back surface of the anode layer 30. The buffer layer 20 is formed on a back surface of the drift layer 18. The cathode layer 32 is formed on a back surface of the buffer layer 20. The cathode layer 32 is exposed on the back surface of the semiconductor substrate, and is in contact with the back surface electrode 26.

In the semiconductor device 2, the drift layer 18 of the IGBT region 4 and the drift layer 18 of the diode region 6 are formed as a common layer. In the semiconductor device 2, the buffer layer 20 of the IGBT region 4 and the buffer layer 20 of the diode region 6 are formed as a common layer.

In the IGBT region 4, each of the trenches 10 extends from a front surface side of the semiconductor substrate into the drift layer 18 through the body layer 16 and the carrier accumulation layer 15. In the IGBT region 4, each of the trenches 10 is provided with an insulated gate 34. The insulated gate 34 includes a gate insulator film 36 and a gate electrode 38. The gate insulator film 36 is formed on an inner wall of the trench 10 and the gate electrode 38 is covered with the gate insulator film 36 and fills the trench 10. The gate electrode 38 is insulated from the front surface electrode 24 by a front surface insulator film 40. The gate electrode 38 is electrically connected to a gate electrode terminal 7 (see FIG. 1).

In the diode region 6, each of the trenches 10 extends from the front surface side of the semiconductor substrate into the drift layer 18 through the anode layer 30. In the diode region 6, each of the trenches 10 is provided with a dummy gate 42. The dummy gate 42 includes a dummy gate insulator film 44 and a dummy gate electrode 46. The dummy gate insulator film 44 is formed on an inner side of the trench 10 and the dummy gate electrode 46 is covered with the dummy gate insulator film 44 and fills the trench 10. In FIGS. 3 and 4, the dummy gate electrode 46 is insulated from the front surface electrode 24 by a front surface insulator film 40, but in a part that is not illustrated, the dummy gate electrode 46 is in contact with the front surface electrode 24 and the dummy gate electrode 46 and the front surface electrode 24 are electrically connected to each other.

In the IGBT region 4, as shown in FIG. 2, the emitter layer 14 is placed between two trenches 10 that are placed side by side, and extends from one of the trenches 10 to another of the trenches 10 in the direction (y direction of the drawing) orthogonal to the direction (x direction of the drawing) in which the trenches 10 extend. When the semiconductor substrate is seen from the top, the body layer 16 is divided into rectangular areas by the trenches 10 and the emitter layer 14, and the body contact layer 12 is placed near the center of each of the areas into which the body layer 16 is divided. The body contact layer 12 is placed away from the emitter layer 14 so that their corner portions do not overlap each other.

In the semiconductor device 2 of the present embodiment, the distance from the body contact layer 12 to the emitter layer 14 in the direction (x direction) in which the trenches 10 extend along the front surface of the semiconductor substrate is made larger than the distance from the body contact layer 12 to each of the trenches 10 in the direction (y direction) orthogonal to the direction in which the trenches 10 extend along the front surface of the semiconductor substrate. This configuration makes it possible to make the body contact layer 12 small while keeping the distance from the body contact layer 12 to each of the trenches 10 small.

When the IGBT region 4 is turned off, the holes accumulated on a back surface side of the carrier accumulation layer 15 flow up to the body layer 16 near the front surface along the trenches 10, and concentratedly flow from the body layer 16 into the body contact layer 12. In so doing, if the distance between each of the trenches 10 and the body contact layer 12 is made large, the holes concentratedly flow through a larger area of the body layer 16, thus making it easy for a latch-up phenomenon to occur. In the semiconductor device 2 of the present embodiment, the distance between each of the trenches 10 and the body contact layer 12 is kept small. This makes it possible to suppress the occurrence of a latch-up phenomenon by narrowing the area in the body layer 16 through which the holes concentratedly flow. This in turn makes it possible to improve the RBSOA tolerance of the semiconductor device 2.

Further, in the semiconductor device 2 of the present embodiment, the body contact layer 12 is made smaller by increasing the distance from the body contact layer 12 to the emitter layer 14 in the direction (x direction) in which the trenches 10 extend. This configuration reduces the amount of holes that are injected from the body contact layer 12 into the drift region 18 during diode operation. This brings about improvement in reverse recovery characteristic during diode operation, thus making it possible to reduce a switching loss.

Furthermore, in the present embodiment, a part of the body contact layer 12 placed at a short distance from the diode region 6 is made small in width in the direction (x direction) in which the trenches 10 extend, and a part of the body contact layer 12 placed at a long distance from the diode region 6 is made large in width in the direction (x direction) in which the trenches 10 extend. That is, the part of the body contact layer 12 placed at a short distance from the diode region 6 is made small, and the part of the body contact layer 12 placed at a long distance from the diode region 6 is made large.

When the IGBT region 4 is turned off, an avalanche current concentratedly flows through a part of the body contact layer 12 placed in the center of the IGBT region 4. In other words, the avalanche current concentratedly flows through a part of the body contact layer 12 in the IGBT region 4 that is placed at a long distance from the diode region 6. In the semiconductor device 2 of the present embodiment, the part of the body contact layer 12 on which the avalanche current is concentrated is made large. This makes it possible to ensure avalanche tolerance during IGBT operation.

In the semiconductor device 2 of the present embodiment, the body contact layer 12 is made small in the IGBT region 4 at a part where the avalanche current is not concentrated (i.e. a part of the IGBT region 4 placed at a short distance from the diode region 6). This configuration reduces the amount of holes that are injected from the body contact layer 12 into the drift layer 18 during diode operation. This brings about improvement in reverse recovery characteristic during diode operation, thus making it possible to reduce a switching loss.

Figure 5:
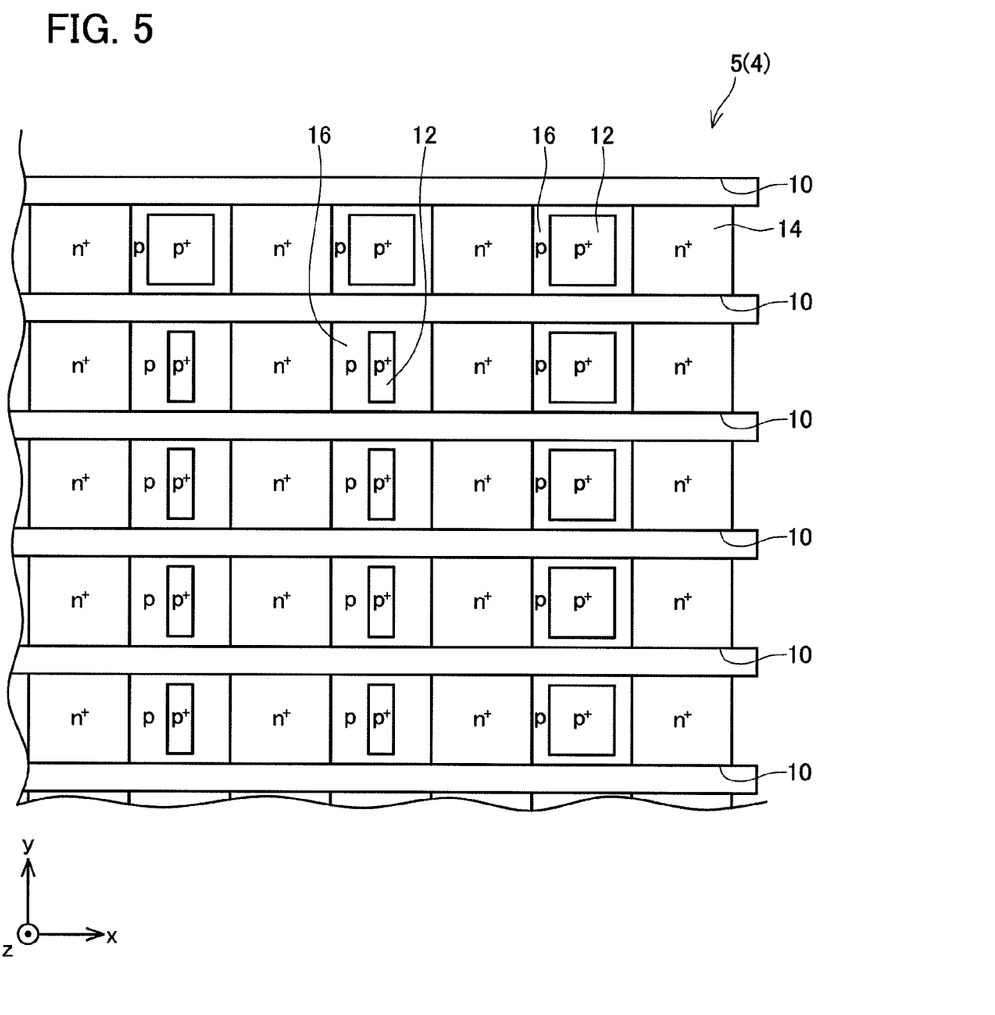
FIG. 5 is a plan view showing the details of the portion V of FIG. 1.

In the semiconductor device 2 of the present embodiment, as shown in FIG. 5, the body contact layer 12 of the IGBT region 4 in a peripheral part of the element region 5 is made larger than the body contact layer 12 of the IGBT region 4 in another part of the element region 5. When the IGBT region 4 is turned off, the holes that flow through the body contact layer 12 in the peripheral part of the element region 5 are especially concentrated. For this reason, making the body contact layer 12 in the peripheral part of the element region 5 small causes a lowering in RBSOA tolerance. Such a lowering in the RBSOA tolerance of the semiconductor device 2 can be prevented by making the body contact layer 12 in the peripheral part of the element region 5 larger than the body contact layers 12 of the IGBT region 4 in another part of the element region 5.

In the semiconductor device 2 of the present embodiment, the sense region 8 includes the same configuration as that of the IGBT region 4, except for the way in which the body contact layer 12 is placed. The sense region 8 is used for detecting the magnitude of a current that flows through the IGBT region 4. The collector layer 22, drift layer 18, body layer 16, carrier accumulation layer 15, gate electrode 38, emitter layer 14, and body contact layer 12 of the sense region 8 are sometimes referred to as a "sense collector layer," "sense drift layer," "sense body layer," "sense carrier accumulation layer," "sense gate electrode," "sense emitter layer," and "sense body contact layer," respectively.

Figure 6:
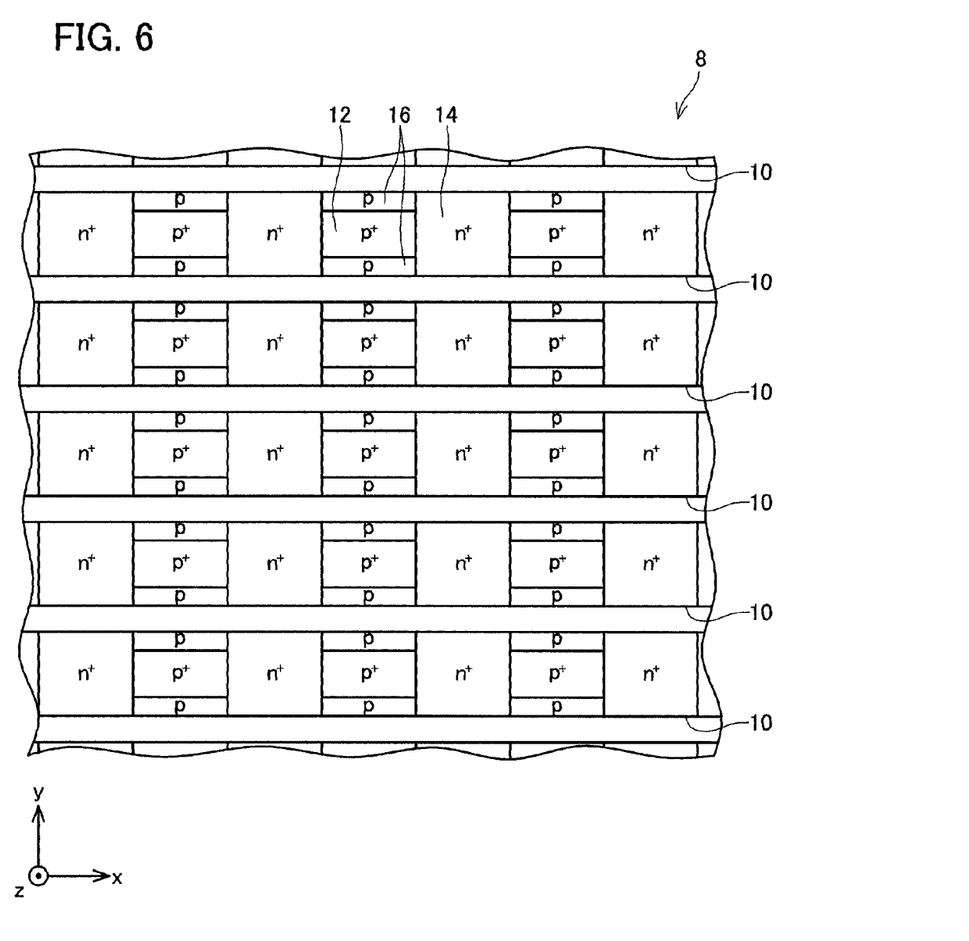
FIG. 6 is a plan view showing the details of the portion VI of FIG. 1.

In the sense region 8, as shown in FIG. 6, the body contact layer 12 is placed in such a manner as to make contact with the emitter layer 14. More specifically, in the sense region 8, the body contact layer 12 is placed in close proximity to the emitter layer 14 so that their corner portions overlap each other. In other words, the body contact layer 12 in the sense region 8 is made larger than the body contact layer 12 in the IGBT region 4. The sense region 8 intrinsically has low breakdown tolerance, and making the body contact layer 12 in the sense region 8 small causes a further lowering in the breakdown tolerance of the sense region 8. As in the present embodiment, the breakdown tolerance of the sense region 8 can be ensured by making the body contact layer 12 of the sense region 8 large.

The placement of the body contact layer 12 in the sense region 8 may be such that the body contact layer 12 is placed on the whole surface of the sense region 8 as shown in FIG. 6. Alternatively, in a part of the sense region 8, the body contact layer 12 may be placed in a manner shown in FIG. 6, and in the remaining part of the sense region 8, the body contact layer 12 may be placed in a manner similar to that in which it is placed in the IGBT region 4.

The embodiment has been described above by using, as an example, a configuration in which the semiconductor device 2 includes an IGBT region 4, a diode region 6, and a sense region 8. The semiconductor device 2 may be configured to include only an IGBT region 4 and a sense region 8 or only an IGBT region 4.

In the embodiment described above, a case has been described where the IGBT regions 4 and the diode regions 6 form a structure that is in the shape of stripes extending along the trenches 10. However, the IGBT regions 4 and the diode regions 6 may form a structure of another shape.

In the embodiment described above, a case has been described where the IGBT regions 4 and the diode regions 6 are placed alternately in the direction (y direction) orthogonal to the direction (x direction) in which the trenches 10 extend, however the way in which the IGBT regions 4 and the diode regions 6 are placed is not limited to this case. For example, when the semiconductor device 2 is viewed from above, the diode regions 6 may be placed in the shape of a circle or in the shape of a rectangle, and the IGBT regions 4 may be placed around the diode regions 6.

In the embodiment described above, a case has been described where the body contact layer 12 is in a rectangular shape when the semiconductor device 2 is viewed from above. However, the body contact layer 12 may be formed in another shape such as a circular shape or a triangular shape.

The representative and non-limiting specific embodiments of the present invention are described above in detail with reference to the drawings. The detailed description provided above is simply intended to provide those skilled in the art with the detail for implementing preferred examples of the present invention and is not intended to limit the scope of the present invention. Additional characteristics and inventions disclosed herein can be used independently of, or along with, other characteristics and inventions in order to provide a further improved semiconductor device.

The combinations of the characteristics and steps disclosed in the detailed description above are not essential for implementing the present invention in the broadest sense and are merely provided in order to explain particularly the representative specific embodiments of the present invention. In addition, various characteristics of the representative specific embodiments described above and various characteristics described in the independent and dependent claims do not have to be combined in accordance with the embodiments described herein or in any particular order when providing additional and useful embodiments of the present invention.

All the characteristics described in the present description and/or the claims are intended to be disclosed separately and independently from each other for the purpose of original disclosure, as well as for the purpose of restricting the claimed subject matters independent of the compositions of the characteristics described in the embodiments and/or the claims. In addition, all value ranges or indications of groups of entities are intended to disclose every possible intermediate value or intermediate entity for the purpose of original disclosure, as well as for the purpose of restricting the claimed subject matters.

The embodiments of the present invention are described above in detail. However, these embodiments are merely illustrative and are not intended to limit the scope of patent claims.

The technology described in the scope of patent claims includes various changes and modifications of the specific embodiments illustrated above. The technical elements exemplified in the present description or the drawings exert technical utility independently or in various combinations, and are not limited to the combinations of the claims described in the application originally filed. Further, the technology exemplified in the present description or the drawings simultaneously achieve a plurality of objects, and achieving one of the objects itself has technical utility.

The invention claimed is:

1. A semiconductor device in which an element region including at least an IGBT region is formed on a semiconductor substrate, the semiconductor device having a front surface electrode provided on a front surface of the semiconductor substrate and a back surface electrode provided on a back surface of the semiconductor substrate, the IGBT region comprising:
a collector layer of a first conductivity type, the collector layer being in contact with the back surface electrode;
a drift layer of a second conductivity type that is provided on a front surface side of the semiconductor substrate with respect to the collector layer;
a body layer of the first conductivity type that is provided on the front surface side of the semiconductor substrate with respect to the drift layer, the body layer being in contact with the front surface electrode;
a gate electrode placed inside a trench extending from the front surface of the semiconductor substrate to the drift layer and that is insulated from the semiconductor substrate and the front surface electrode by an insulator film;
an emitter layer of the second conductivity type that is provided between the body layer and the front surface electrode, the emitter layer being in contact with the insulator film of the gate electrode and the front surface electrode; and
a contact layer of the first conductivity type that is provided between the body layer and the front surface electrode, the contact layer being in contact with the front surface electrode, and having a higher impurity concentration than the body layer, wherein, assuming that an x direction is a direction in which the trench extends along the front surface of the semiconductor substrate and that a y direction is a direction orthogonal to the x direction along the front surface of the semiconductor substrate, a distance from the contact layer to the emitter layer in the x direction is larger than a distance from the contact layer to the trench in the y direction.

2. The semiconductor device as set forth in claim 1, further comprising a carrier accumulation layer of the second conductivity type that is provided inside the body layer so as to intervene between the drift layer and the front surface electrode.

3. The semiconductor device as set forth in claim 1, wherein a distance from the contact layer to the emitter layer in the x direction in a peripheral part of the element region is smaller than a distance from the contact layer to the emitter layer in the x direction in another part of the element region.

4. The semiconductor device as set forth in claim 1, wherein a sense IGBT region is further formed on the semiconductor substrate, and the sense IGBT region comprises:

a sense collector layer of the first conductivity type, the sense collector layer being in contact with the back surface electrode;

a sense drift layer of the second conductivity type that is provided on the front surface side of the semiconductor substrate with respect to the sense collector layer;

a sense body layer of the first conductivity type that is provided on the front surface side of the semiconductor substrate with respect to the sense drift layer, the sense body layer being in contact with the front surface electrode;

a sense gate electrode placed inside a trench extending from the front surface of the semiconductor substrate to the sense drift layer and that is insulated from the semiconductor substrate and the front surface electrode by an insulator film;

a sense emitter layer of the second conductivity type that is provided between the sense body layer and the front surface electrode, the sense emitter layer being in contact with the insulator film of the sense gate electrode and the front surface electrode; and a sense contact layer of the first conductivity type that is provided between the sense body layer and the front surface electrode, the sense contact layer being in contact with the front surface electrode and having a higher impurity concentration than the sense body layer, wherein a distance from the sense contact layer to the sense emitter layer in the x direction in the sense IGBT region is smaller than a distance from the contact layer to the emitter layer in the x direction in the IGBT region.

* * * * *